May 10, 1966 G. SCHWEITZER 3,251,008

VOLTAGE SENSITIVE CAPACITOR-TUNED OSCILLATOR
WITH AUTOMATIC FREQUENCY CONTROL
Filed March 9, 1964

INVENTOR.
GERHARD SCHWEITZER
BY Brumbaugh, Free, Graves & Donohue
his ATTORNEYS.

United States Patent Office 3,251,008
Patented May 10, 1966

3,251,008
VOLTAGE SENSITIVE CAPACITOR-TUNED OSCILLATOR WITH AUTOMATIC FREQUENCY CONTROL

Gerhard Schweitzer, Mannheim-Rheinau, Germany, assignor to Mrs. Regina Kohler, born Gorler, trading as the firm Julius Karl Gorler, Berlin-Reinickendorf, Germany Filed Mar. 9, 1964, Ser. No. 350,334
Claims priority, application Germany, Mar. 23, 1963, G 37,342
9 Claims. (Cl. 331—117)

Figure 1:
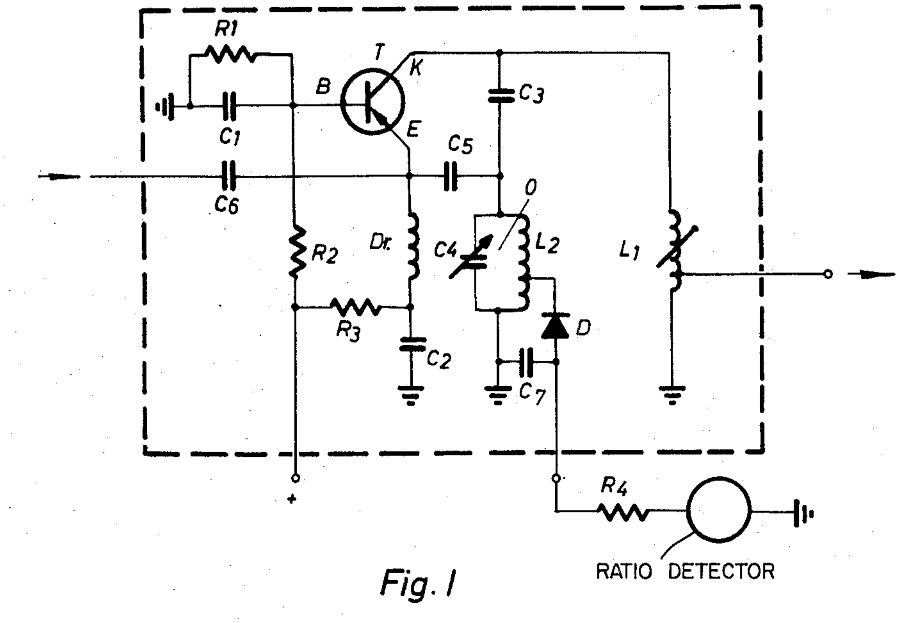

This invention relates to a circuit for the automatic frequency control of oscillators, particularly in the ultra-high-frequency range, by means of a semi-conductor diode supplied with a control voltage.

There are a number of known methods for using a semi-conductor diode as an oscillator tuning component. In one, a forward direct current flowing through the diode is used to obtain the control action. That is, the diode is in circuit with a source of control voltage and a source of forward biasing voltage, and the diode is also placed in series with a capacitor in parallel with the oscillatory circuit. The control voltage then varies the amount of and/or angle of high frequency current flow in the diode so that the series capacitor is, to a variable extent, effectively in parallel with the tuning circuit to detune it as a function of the control voltage. With this arrangement, the diode may be regarded as a controllable variable resistor. A disadvantage of such method is that the control voltage source must be of relatively low-impedance in order to provide the control current which is involved.

In a second method, the diode operates with reverse bias with negligible ohmic current and, in this condition, behaves substantially as a variable capacity which is varied according to the magnitude of the polarizing voltage. The polarizing potential is comprised of a fixed negative bias and of a variable control voltage taken from an earth-symmetrical ratio detector i.e., a ratio detector which is balanced with respect to ground. This latter method has the advantage that no control current is needed, it being possible to use a practically zero-current control voltage, but such method also has the drawback that an additional bias voltage supply is required. The bias voltage (i.e., the fixed component of polarizing voltage) may be derived, for example, from the oscillator power supply through a suitably arranged potential divider. In order, however, to avoid any undesirable change in the oscillator frequency as a result of variations in the bias voltage, additional means of providing stability are also necessary, such as, say, glow-discharge lamps or Zener diodes.

The second method may be practiced by use of a circuit in which the grid voltage of the oscillator tube is used to provide the diode biasing potential, such circuit being disclosed in my U.S. Reissue Patent 25,256, reissued October 9, 1962. However, such circuit is not particularly well adapted for use with transistor oscillator circuits.

In the described methods, the diode may with advantage be associated with the oscillator circuit by way of a capacitor placed in series with the diode. According to the value of this series capacitor, the oscillator tuning can be set to the desired range in relation to the control voltage, and moreover, the oscillator voltage on the diode may be reduced as a result of the voltage division produced by connecting the coupling capacity and diode capacity in series so that the diode bias is not adversely affected by rectification currents.

The present invention differs from the systems previously described in that a bias voltage of substantially zero value is provided for the diode. Moreover, preferably one or more resistors are inserted in the control-voltage supply lead. Thus, in the circuit to which this invention relates, the diode is operated at or near the zero point of its characteristic. As there is no need to produce any fixed bias voltage, a whole series of components such as resistors, stabilizers etc. can be omitted. The possibility of the oscillator being affected by the diode because of variations in operating voltage is largely eliminated.

In the present invention, the control effect depends solely on the variable control voltage derived from a ratio detector which is preferably symmetrically connected with respect to earth or ground. If this control voltage is zero, the diode operates with the capacity it has at or near the zero point of its characteristic. The diode may be so polarized that, when the control voltage becomes negative the diode ceases to conduct (i.e., has very low current conduction); that is to say, the diode capacity is reduced and the oscillator is tuned to higher frequencies. When the control voltage becomes positive, the diode is so controlled as to conduct, its capacity being increased and the oscillator being tuned to lower frequencies. If desired, the polarity of the diode can be reversed to achieve the effect that positive control voltages cause a change to non-conduction and negative control voltages result in conduction, the direction of the automatic readjustment reversing with the control voltage.

In the conducting range, the current flowing through the diode increases according to how far into this range the diode is brought. Within this range, in other words, the diode functions additionally as a resistor of which the resistance varies according to the control voltage. The oscillator voltage on the diode also produces a flow of current, even when the bias of the diode is in the non-conducting range, if the oscillator voltage is high enough, so that the voltage peaks bring the diode into the conducting range. The farther the diode is brought into the conducting range, the greater becomes its capacity, but the lesser its resistance, so that both produce an effect.

In doing without a special bias-voltage supply, the invention deliberately accepts the additional resistance effect of the diode. This is because it has been found, with the arrangements provided by the invention, that the capacitive effect of the diode is still so preponderant that an adequate frequency change and acceptable tuning of the oscillator can be obtained.

In one particularly advantageous form of the invention, the resistor or resistors in the control voltage supply lead are of such a size that, for equal positive and negative control voltages, the resulting frequency changes in the oscillator frequency are approximately equally great and are opposite in direction. In this way, the unwanted effect of the controllable diode resistance is not serious so that, to all intents and purposes, only the variable capacity affects the tuning of the oscillator circuit. In particular, by suitably selecting the value of the resistance in the external lead for the diode, the ohmic effect of the diode is made precisely such that the non-linear action of the diode capacity is minimized and the oscillator frequency changes are nearly proportional to the control voltage. Moreover, there is a particular advantage in using a filter resistor in the control-voltage supply lead as a resistor for bringing the oscillator frequency into symmetry.

A particularly effective circuit arrangement in accordance with the invention results from connecting the diode directly to the oscillatory circuit and more particularly to a tapping point thereon. Since the capacity and the capacity variation of the diode at the zero point of its characteristic and in the conducting range are far greater than is the case in the non-conducting range, a far greater frequency variation than necessary is obtained when the diode is connected directly in parallel with the oscillator circuit. The diode may, therefore, alternatively be connected to a tapping point in the oscillator circuit, so that the diode's capacity changes have a less pronounced affect.

Figure 2:
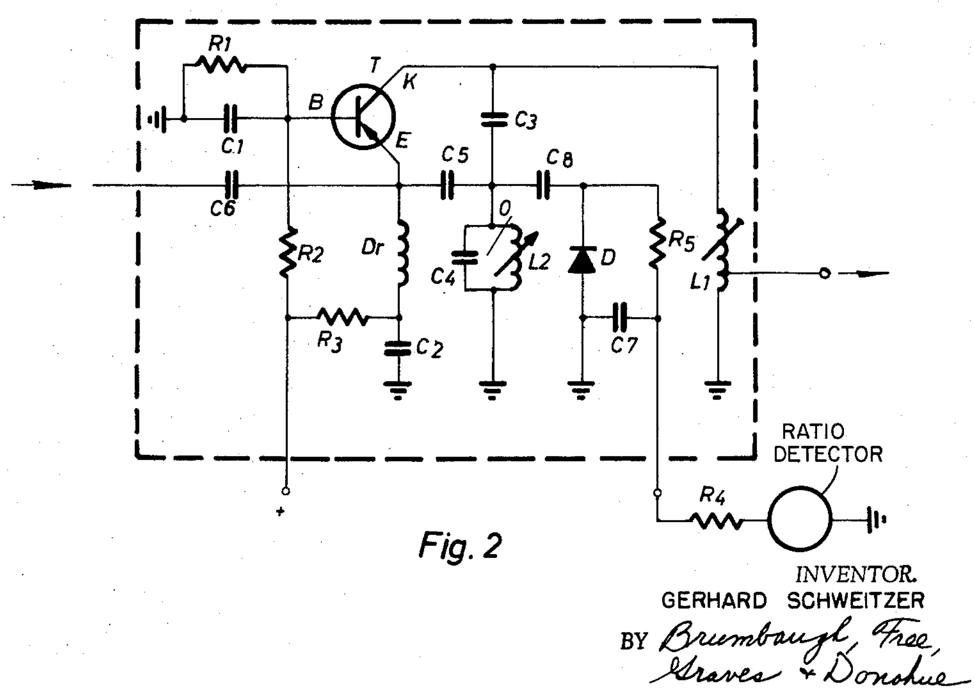

For a better understanding of the invention, reference is made to the following description of exemplary embodiments thereof and to the accompanying drawings, in which:

FIGURE 1 is a schematic diagram of circuits of a frequency modulation receiver embodying the invention, such circuits including a tunable oscillator, with a diode for controlling the frequency of the oscillator; and FIGURE 2 is a modification of the circuits shown in FIGURE 1.

The character of the invention is explained below in detail, taking as an example the circuitry for an ultra-high-frequency self-oscillating tunable mixing stage or FM tuner stage for a frequency modulation receiver. The components of the tuner stage are shown within the dash-line box, other components of the receiver which cooperate with the stage being shown outside the box. The components of the receiver which do not cooperate with the tuner stage have, for clarity, been omitted from the drawing.

FIGURE 1 shows a transistor, T, with base connection B, emitter E, and collector K. The potential divider $R_1$ (for example, 33 ohms) and $R_2$ (or example, 4.7 ohms) serves in the usual way to adjust the D.C. operating point of the transistor. The capacitor $C_1$ provides a high-frequency short-circuit to earth for the base electrode, $C_1$ having a capacitance of, say 1,000 picofarads (i.e., 1,000 micromicrofarads). For convenience, the wor "picofarad" is abbreviated herein as "pf." Resistor $R_3$ (for example, 560 ohms) with capacitor $C_2$ (for example, 1000 pf.), provides current stabilization. The collector K is connected to an intermediate-frequency circuit essentially consisting of coil $L_1$ and capacitor $C_3$ (for example, 60 pf.). Through capacitor $C_5$, an oscillatory circuit O, consisting of coil $L_2$ and variable capacitor $C_4$, is also connected to the collector. Feedback of the oscillator voltage takes place in the usual way through capacitor $C_5$, the correct phase being produced by choke D*r*. The frequency modulated R.F. input signal is conveyed to the emitter E by way of capacitor $C_6$.

The coil $L_2$ of the oscillatory circuit has intermediate its ends a tapping point to which is connected one end of a diode D which serves as a control component for obtaining automatic frequency control of the mixing stage. As shown, the diode D is connected by its negative electrode or cathode to the said tapping point. As will be evident, the diode cathode is grounded for direct current by way of the portion of coil $L_2$ below the tapping point and the direct connection of the lower end of oscillatory circuit O to ground. The capacitors $C_3$ and $C_5$ prevent flow of the direct current between the diode and, respectively, the emitter E and the collector K of the transistor T. The diode anode has a high frequency short-circuit to earth through capacitor $C_7$ (for example 10,000 pf.). The control voltage, taken from an earth-symmetrical ratio detector is also connected to the anode, through a resistor $R_4$. The connection of the ratio detector to ground serves (together with the described connection to ground of the anode terminal of the diode) to apply a zero biasing voltage to the diode.

When the control voltage is zero, both electrodes of the diode are substantially at the same D.C. ground potential (i.e., there is substantially no D.C. or low frequency potential across the diode), and the diode capacity at or near the zero point of the diode capacitance characteristeric is effective in the tapping of coil $L_2$. If the control voltage becomes negative, the diode capacity drops; if the control voltage becomes positive, the diode capacity rises. With respect to the controlling effect of the diode capacity on the oscillator frequency, an opposite effect due to the controlled effective resistance of the diode is superimposed, as has been discussed above. It has been found, however, that the capacitive control predominates, especially if resistor $R_4$ is of suitable value. According to a well-known rule of thumb, should the control voltage be zero, the oscillatory circuit will be subject to about half the value of resistor $R_4$.

Since the control characteristic of the diode capacity, which is fairly flat at high non-conduction voltages, constantly steepens as the point of zero bias is approached and becomes still steeper in the conducting range, the amount of frequency control provided by the diode capacity alone is not the same for substantially equal negative and positive control voltages. According to the best practice of the invention, however, the resistor $R_4$ in the control circuit is of such value that, because of such resistor, variations for equal positive and negative control voltages become approximately equal. That is, the invention utilizes the diode resistance characteristic to produce a voltage drop across the resistor $R_4$ so as to reduce the voltage actually appearing across the diode in the conducting direction and, hence, to give a reasonably linear relation of control voltage to frequency change in spite of the inherently non-linear capacitive control characteristic.

In oscillatory circuits that are tuned wtih a variable inductance rather than with a variable capacitor, it is usually undesirable to connect the diode to the oscillatory circuit by a tapping off of the diode from the variable inductance. Instead, it is preferred that the tuning diode be capacitively coupled as shown in FIG. 2.

FIGURE 2 is, in the main, the same as FIGURE 1, except that in oscillator circuit O it is not capacitor $C_4$, but inductance coil $L_2$, which is variable. As illustrated, diode D is coupled to the oscillatory circuit O through coupling capacitor $C_8$ (approximately 3–10 pf.). In the case of FIG. 2, it is the anode of the diode which is grounded for direct current.

The resistor in the control circuit of FIG. 2 is divided into resistors $R_4$ and $R_5$. As in FIG. 1, the capacitor $C_7$ prevents current at oscillator frequency from reaching the control lead. Because the diode D is connected in rectifying relation with, for example, the capacitor $C_7$ in FIG. 1 and in FIG. 2, the charge of this capacitor will develop a small amount of D.C. bias across D. Any bias which happens to be produced by diode rectification does not, however, interfere with or change appreciably the heretofore described operation of the diode.

The invention provides a simple circuit for frequency regulation by means of a diode. Evidently, the invention is capable of being embodied in other circuits similar to those described herein for the tuning of oscillatory circuits and frequency-determining components. The use of the invention not only saves a number of component parts as compared with prior art circuits, but in addition, has the advantage that the frequency is largely unaffected by variations in the power supply voltage or in the bias voltage supply.

I claim:

1. Automatic frequency controlled apparatus comprising, an oscillator circuit, a semiconductor diode connected to said circuit to vary the frequency of the oscillations thereof in accordance with a control voltage applied to said diode, said diode being connected so as to have no appreciable direct current bias when said control voltage is zero, and a voltage source of variable amplitude and polarity connected in a direct current circuit with said diode and responsive to the frequency of oscillation of said oscillator circuit to vary said control voltage, said source being the only voltage source connected in a direct current circuit with said diode and providing a substantially zero control voltage when said oscillator circuit is tuned to a selected frequency of oscillation.

2. Apparatus as in claim 1 in which said diode is directly connected to the oscillator circuit.

3. Apparatus as in claim 1 in which said diode is connected to a tap on said oscillator circuit.

4. Apparatus as in claim 1 in which said oscillator circuit includes a variable capacitance and an inductance, and in which said diode is connected to a tap on said inductance.

5. Apparatus as in claim 1 in which said oscillator circuit includes a capacitance and a variable inductance, and in which said diode is connected through a coupling capacitor to a point in said oscillator circuit between said capacitance and said variable inductance.

6. Automatic frequency controlled apparatus comprising, an oscillator circuit, a semiconductor diode connected to said circuit to vary the frequency of the oscillations thereof in accordance with a control voltage applied to said diode, said diode being connected so as to have no appreciable direct current bias when said control voltage is zero, a voltage source of variable amplitude and polarity connected in a direct current circuit with said diode and responsive to the frequency of oscillation of said oscillator circuit to vary said control voltage, said control voltage being substantially zero when said oscillator circuit is tuned to a selected frequency of oscillation, and means rendering any bias voltage on said diode of a value lower than that of voltage swings of said source so as to produce forward and reverse control voltages on said diode by opposite polarity ones of said swings.

7. Automatic frequency controlled apparatus comprising, an oscillator circuit, a semiconductor diode connected to said circuit to vary the frequency of the oscillations thereof in accordance with a control voltage applied to said diode, said diode being connected so as to have no appreciable direct current bias when said control voltage is zero, a source of voltage of variable amplitude and polarity connected in a direct current circuit with said diode to provide said control voltage, said source being the only voltage source connected in a direct current circuit with said diode, means rendering any bias voltage on said diode of a value lower than that of voltage swings of said source so as to produce forward and reverse control voltages on said diode by opposite polarity ones of said swings, and resistor means connected in said direct current circuit in series with said diode and said source, said resistor means having a resistance value proportioned to the diode forward resistance to produce a substantially linear relation between a change in said control voltage and the resulting change in said frequency over a range of said control voltage between equal-amplitude negative and positive values for such voltage.

8. Automatic frequency controlled apparatus comprising, a transistor having base, emitter, and collector electrodes, an oscillator circuit coupled to said collector electrode, a semiconductor diode connected to said circuit to vary the frequency of oscillation thereof in accordance with a control voltage applied to said diode, a voltage source connected to said oscillator circuit in a direct current circuit with said diode to provide said control voltage and responsive to the frequency of oscillation of said oscillator circuit to vary the amplitude and polarity of such voltage, said source being the only voltage source connected in a direct current circuit with said diode and providing a substantially zero control voltage when said oscillator circuit is tuned to a selected frequency of oscillation, and resistor means connected in said direct current circuit in series with said diode and said source, said resistor means having a resistance value proportioned to the diode forward resistance to produce a substantially linear relation between a change in said control voltage and the resulting change in said frequency over a range of said control voltage between equal-amplitude negative and positive values for such voltage.

9. Apparatus in accordance with claim 8 wherein said source is referenced to a ground potential and wherein said oscillator circuit provides a path between said source and said ground potential for the direct current through said diode.

References Cited by the Examiner

UNITED STATES PATENTS

| | | | |
|---|---|---|---|
| 2,936,428 | 5/1960 | Schweitzer | 331—177 |
| 3,067,394 | 12/1962 | Zimmerman et al. | 331—36 |
| 3,148,283 | 9/1964 | Messenger | 331—177 |

OTHER REFERENCES

Hammerslag: Electronics "Signal-Seeking Auto Radio Uses Semi-conductor Tuning," pages 60–62, 7–22–60.

McMahon: Electronics Industries "Voltage-Variable Capacitors," pages 90–94, December 1959.

Silverman: CQ, "Voltage Variable Silicon Capacitors," pages 40–42, February 1961.

ROY LAKE, *Primary Examiner.*

J. KOMINSKI, *Assistant Examiner.*